United States Patent [19]

Hill

[11] 4,339,527

[45] Jul. 13, 1982

[54] PROCESS FOR USING PHOTOPOLYMERIZABLE COMPOSITIONS

[75] Inventor: Martin J. Hill, Sayre, Pa.

[73] Assignee: E. I. Du Pont de Nemours and Company, Wilmington, Del.

[21] Appl. No.: 174,256

[22] Filed: Jul. 31, 1980

Related U.S. Application Data

[60] Division of Ser. No. 8,048, Jan. 31, 1979, Pat. No. 4,230,790, which is a continuation of Ser. No. 802,485, Jun. 1, 1977, abandoned, which is a continuation-in-part of Ser. No. 593,106, Jul. 4, 1975, abandoned.

[51] Int. Cl.³ ................................................. G03C 5/00
[52] U.S. Cl. .................................... 430/322; 430/302; 430/313; 430/323
[58] Field of Search ...................... 204/159.15, 159.23; 430/281, 286, 288, 322, 323, 302, 313

[56] References Cited

U.S. PATENT DOCUMENTS

| | | | |
|---|---|---|---|
| 3,470,079 | 9/1969 | D'Alelio | 204/159.15 |
| 3,754,054 | 4/1973 | Kimura et al. | 204/159.15 |
| 3,759,808 | 9/1973 | Parker et al. | 204/159.23 |
| 3,853,728 | 12/1974 | Wrzesinski | 204/159.15 |
| 3,856,643 | 12/1974 | Nakamoto et al. | 204/159.15 |
| 3,862,021 | 1/1975 | Hagihara et al. | 204/159.15 |
| 3,891,441 | 6/1975 | Tsuji et al. | 430/381 |

FOREIGN PATENT DOCUMENTS 1235769 6/1971 United Kingdom .

*Primary Examiner*—Jack P. Brammer

[57] ABSTRACT

Process for using photopolymerizable compositions involving monomers of ethylenically unsaturated esters of difunctional acids and polymethylene glycols terminated with acrylate and methacrylate groups.

5 Claims, No Drawings

PROCESS FOR USING PHOTOPOLYMERIZABLE COMPOSITIONS

CROSS REFERENCE TO RELATED APPLICATION

This is a divison of Ser. No. 8,048 filed Jan. 31, 1979, now U.S. Pat. No. 4,230,790, which is a continuation of Ser. No. 802,485 filed June 1, 1977, now abandoned, which is a continuation-in-part of Ser. No. 593,106, filed July 4, 1975, now abandoned.

BACKGROUND OF THE INVENTION

1. Field of the Invention

This invention relates to monomers for photopolymerizable compositions, which are useful as photoresists and in other photomechanical applications.

2. Description of the Prior Art

Compositions capable of polymerization under the influence of actinic radiation to form rigid, insoluble, tough, polymer-containing structures are known. Compositions of this type are described in Plambeck, U.S. Pat. No. 2,760,863, and Chu and Cohen, U.S. Pat. No. 3,649,268. Additional photopolymerizable compositions are described in British patent specifications Nos. 741,470, 786,119, 802,853, and 807,948. Photopolymerizable compositions, however, may be affected by variations in atmospheric conditions, and have a tendency to be brittle on exposure and crack upon aging, especially at relatively low humidities and temperatures.

A. B. Jennings, in U.S. Pat. No. 3,036,914, discloses photopolymerizable compositions which form flexible layers free from the disadvantages just described, by adding polyethylene oxides and linear cellulose esters to ethylenically unsaturated compounds, e.g., acrylic acid diesters of a mixture of polyethylene glycols. Such systems, however, can become less sensitive to light in storage.

Dill, in U.S. Pat. No. 3,336,418, describes the use of the acrylyloxyalkyl ester monomers as plasticizers in nonphotosensitive vinyl halide polymer compositions which are pressure molded to hard, rigid material at elevated temperatures.

It is therefore desirable to have photopolymerizable compositions which, on exposure, produce flexible polymeric materials which are essentially free from brittleness and do not become substantially less sensitive to light in storage.

SUMMARY OF THE INVENTION

Accordingly, in a photopolymerizable composition consisting essentially of the photoinitiator compound thermally inactive at and below 85° C., 0.001 to 20 parts by weight based on the weight of ethylenically unsaturated compound; an organic polymeric film forming binder free from pendant unsaturated groups, 95 to 10 parts by weight based on the weight of the composition; and an ethylenically unsaturated addition polymerizable compound, 5 to 90 parts by weight based on the weight of the composition, the improvement comprising said ethylenically unsaturated addition-polymerizable compound having the formula

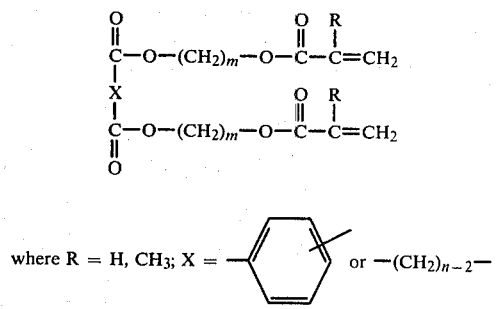

and m and n are independently from 2 to 10.

DESCRIPTION OF THE PREFERRED EMBODIMENTS

The phrase "consisting essentially of" as used in the definition of the photopolymerizable composition means that unspecified materials can be present in amounts which do not prevent the advantages of the invention from being realized.

Photopolymerizable compositions of the invention contain at least one non-gaseous, ethylenically unsaturated compound capable of forming a high polymer by free-radical initiated, chain-propagating, addition polymerization. Such compounds, referred to as "monomers" polymerize when the photosensitive composition is exposed to actinic radiation, e.g., ultraviolet light. The properties of these compositions are important both before and after exposure since they must be photosensitive, i.e., polymerize, on exposure, and form a polymer with the desired properties upon completion of the exposure.

The monomers herein described provide a unique combination of properties in photosensitive systems, and particularly in a solid photopolymerizable layer on a sheet support. Photopolymerizable compositions containing the described monomers are not subject to loss of monomer upon storage, e.g., storage of dry film photoresist, at elevated temperatures due to the low vapor pressure of the monomers. In addition, the polymers formed by these monomers in combination with conventional organic polymeric binders for photopolymerizable compositions comprise flexible polymeric materials, especially, films, which are not brittle and which are insoluble in solvents in which the unexposed areas are soluble (permitting wash out development) and which are resistant to treating fluids, such as ferric chloride.

The monomers of the invention are esters of difunctional acids and polymethylene glycols terminated with acrylate and methacrylate groups. These monomers have a boiling point of above 100° C. at normal atmospheric pressure and a molecular weight of at least 150. They are non-volatile at room temperature and should be present in the ratio of from 5 to no more than 90 parts by weight of monomer per 100 parts by weight of the photopolymerizable composition.

Some ethylenically unsaturated monomers of this invention are:
 bis(2-methacryloxyethyl) adipate
 bis(3-methacryloxypropyl) adipate
 bis(4-methacryloxybutyl) adipate
 bis(6-methacryloxyhexyl) adipate
 bis(10-methacryloxydecyl) adipate
 bis(6-methacryloxyhexyl) malonate
 bis(6-methacryloxyhexyl) phthalate bis(2-methacryloxyethyl) phthalate
bis(2-methacryloxyethyl) isophthalate
bis(2-methacryloxyethyl) terephthalate
bis(10-methacryloxydecyl) sebacate
bis(6-acryloxyhexyl) adipate
bis(2-acryloxyethyl) adipate The photopolymerizable compositions of the invention contain at least one organic polymeric film forming binder free from pendant unsaturated groups. The binders usable in this system are macromolecular linear organic polymers, preferably having a molecular weight within the range of 2000 to 5 million and are capable of forming smooth, hard films. The binder is present in an amount of 95 to 10 parts by weight per 100 parts by weight of the photopolymerizable composition. Suitable specific binders which can be used as the sole binder or in combination with others include:

Polyacrylate and alpha-alkyl polyacrylate esters, e.g., polymethyl methacrylate and polyethyl methacrylate; Polyvinyl esters, e.g., polyvinyl acetate, polyvinyl acetate/acrylate, polyvinyl acetate/methacrylate and hydrolyzed polyvinyl acetate; Ethylene/vinyl acetate copolymers; Polystyrenes; Vinylidene chloride copolymers, e.g., vinylidene chloride/acrylonitrile; vinylidene chloride/methacrylate and vinylidene chloride/vinyl acetate copolymers; Polyvinyl chloride and copolymers, e.g., polyvinyl chloride/acetate; Saturated and unsaturated polyurethanes; Synthetic rubbers, e.g., butadiene/acrylonitrile, acrylonitrile/butadiene/styrene, methacrylate/acrylonitrile/butadiene/styrene co-polymers, 2-chlorobutadiene/1,3-polymers, chlorinated rubber, and styrene/butadiene/styrene, styrene/isoprene/styrene block copolymers; High molecular weight polyethylene oxides of polyglycols having average molecular weights from about 4,000 to 1,000,000; Epoxides, e.g., epoxides and capped with acrylates or methacrylates; Copolyesters, e.g., those prepared from the reaction product of a polymethylene glycol of the formula $HO(CH_2)nOH$, where n is a whole number 2 to 10 inclusive, and (1) hexahydroterephthalic, sebacic and terephthalic acids. (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; Nylons or polyamides, e.g., N-methoxymethyl polyhexamethylene adipamide; Cellulose esters, e.g., cellulose acetate, cellulose acetate succinate and cellulose acetate butyrate; Cellulose ethers, e.g., methyl cellulose, ethyl cellulose and benzyl cellulose; Polycarbonates; Polyvinyl acetal, e.g., polyvinyl butyral, polyvinyl formal; Polyformaldehydes.

The type of binder chosen is significant from the standpoint that the binder influences tensile strength and solubility properties of the photopolymerizable layer. Acrylic polymers, including those without halide substitution, are preferred binders, and polymethyl methacrylate and copolymers thereof with other compounds such as acrylic acid are particularly preferred. Metal salt binders are precluded.

A wide range of non-polymerizable plasticizers are effective in achieving improved exposure and development temperature latitude. When a macromolecular binder is present in the layer, plasticizer selection would be based on those well known in the art to be compatible with it as well as the monomer and other components. With acrylic binders, for example, dibutyl phthalate and other esters of aromatic acids; esters of aliphatic polyacids such as diisoctyl adipate, nitrate esters, etc.; aromatic or aliphatic acid esters of glycols, polyoxyalkylene glycols, aliphatic polyols, etc.; alkyl and aryl phosphates; low molecualr weight polyesters or poly-$\alpha$-methylstyrenes; chlorinated paraffins; and sulfonamide types may be used. In general, water insoluble plasticizers are preferred for greater high humidity storage stability, but are not necessary to get improved latitude. The amount of plasticizer and other additives listed below, when present in the photopolymerizable composition, is such that does not prevent the advantages of the photopolymerizable composition from being realized.

Additives such as natural or synthetic resins, antioxidants, dyes, inhibitors, activators, fillers, pigments, antistatic agents, flame-retardant agents, thickeners, thixotropic agents, surface-active agents, light scattering agent, viscosity modifiers, extending oils, plasticizers and tackifiers may be added to the photopolymerizable compositions.

In addition, the photopolymerizable compositions and layers, especially when used in the preparation of resist lithographic printing plates, may and preferably do contain a colorant and/or a color producing agent, e.g., a leuco dye. The amine-substituted leuco dyes can function both in the role of a color forming agent and a free radical producing agent. Especially useful leuco dyes are those having at least one dialkylamine group. Also, any amine-substituted leuco triphenylmethane dye or various salts of the dye, e.g., the HCl salt of the leuco blue dye can be used. Illustrations of suitable dyes include tris-(4-N,N-diethylamino-o-toly)-methane trihydrochloride, bis(4-N,N-diethylamino-o-tolyl) thienylmethane, bis(4-N,N-diethylamino-o-tolyl)methylene dioxyphenylmethane, leuco neutral shade dye, i.e., bis(4-N,N-diethylamino-o-tolyl)-benzyl thiophenylmethane, Leuco Malachite Green (C.I. Basic Green 4), leuco forms of Crystal Violet, Brilliant Green (C.I. Basic Green 1), Victoria Green 3B (C.I. Basic Green 4), Acid Green GG (C.I. Acid Green 3), Methyl Violet (C.I. Basic Violet 1), Rosaniline (C.I. Basic Violet 14), etc. The salt form, e.g, HCl salts, salts with Lewis acids, sulfuric acid salts, p-toluene sulfonic acid salts, etc., of the leuco dye can be used but the free base is preferred.

In addition, the photopolymerizable composition also contains at least one photoinitiator compound, used to start the monomer photopolymerization, which is activated by actinic radiation and is present in the amount of 0.001 to 20 parts by weight of the monomer, ethylenically unsaturated compound. The photoinitiators are inactive thermally at and below 85° C. which precludes the presence of thermal initiators, e.g., peroxide compounds, in the photopolymerizable compositions. Such compounds are frequently used in a photoinitiator system comprising a combination of several organic compounds for production of free radicals.

A preferred class of free-radical generating, addition polymerization initiators activatable by actinic light and thermally inactive at and below 85° C. includes the substituted or unsubstituted polynuclear quinones which are compounds having two intracyclic carbonyl groups attached to intracyclic carbon atoms in a conjugated carbocyclic ring system. Suitable such initiators include 9,10-anthraquinone, 1-chloro-anthraquinone, 2-chloroanthraquinone, 2-methyl-anthraquinone, 2-ethyl-anthraquinone, 2-tert-butylanthraquinone, octamethyl-anthraquinone, 1,4-naphthoquinone, 9,10- phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,10-tetra-hydronaphthacenequinone, and 1,2,3,4-tetrahydrobenz (a) anthracene-7,12-dione. Other photoinitiators which are also useful, even though some may be thermally active at temperatures as low as 85° C., are described in Plambeck, U.S. Pat. No. 2,760,863 and include vicinal ketaldonyl compounds, such as diacetyl, benzil, etc.; α-ketaldonyl alcohols, such as benzoin, pivaloin, etc.; acyloin ethers, e.g., benzoin methyl and ethyl ethers, etc.; α-hydrocarbon substituted aromatic acyloins, including α-methylbenzoin, α-allylbenzoin, and α-phenylbenzoin.

Particularly preferred photoinitiators are the 2,4,5-triphenylimidazolyl dimers disclosed in Chambers, U.S. Pat. No. 3,479,185, Nov. 18, 1969. Also useful are the photoinitiating combinations disclosed in British Pat. No. 1,090,142, as well as the combinations of Michler's ketone with 2,4,5-triphenylimidazolyl dimers disclosed in Chang and Fan, U.S. Pat. No. 3,549,367, issued Dec. 22, 1970. Other useful initiators and initiator systems are disclosed in Fan, U.S. Pat. No.3,558,322, issued Jan. 26, 1971 and in Chang, U.S. Pat. No. 3,661,558, issued May 9, 1972.

To prepare the photopolymerizable composition, the various ingredients are mixed together in their proper ratios and may be milled in a ball-mill for a period of time, or mixed rapidly, stirring the composition sufficiently to obtain thorough mixing.

The prepared photopolymerizable composition is coated by various ways (doctor blade, skim, hopper, reverse roll) on a sheet support and dried. Any of the conventional supports such as cellulose ester films, polyethylene, polypropylene, polystyrene, polyethylene terephthalate and other polyesters may be used. Preferably the composition is coated on a layer of polyethylene terephthalate which has been treated in a manner similar to that described in Alles, U.S. Pat. No. 2,779,684.

The photopolymerizable compositions of the invention are particularly useful for photoresist films, which comprise a sheet support bearing a layer of the photopolymerizable composition; the surface of the photopolymerizable layer may be protected by a removable cover sheet or layer as described in Celeste, U.S. Pat. No. 3,469,982. These film elements may be used to modify a surface by etching or plating, using the resist image of the exposed and developed photopolymerizable layer to protect the nonimage areas of the surface, as described in the Celeste patent above. Preferably, the surfaces for such treatment are inorganic and, particularly, metal. A common use of such elements is to etch a copper clad epoxyfiberglass circuit board to make a printed circuit. The compositions of the invention are particularly suited for this use since the resist image is flexible and can be trimmed with a knife where necessary while a brittle photoresist would crack.

Accordingly, the invention provides a process comprising:

(1) applying to a surface the surface of a solid, unexposed photopolymerizable layer comprised of the composition defined above, while the other surface of the layer has adhered thereto with low to moderate adherence a thin, flexible sheet support, then in either order;

(2) exposing the layer, imagewise to actinic radiation to form a polymeric image in the layer;

(3) removing the sheet support from the resulting image-bearing layer; and (4) removing (e.g., washing out) the unexposed areas of the layer to form a resist image of polymeric material; and (5) permanently modifying the adjacent areas on said surface which are unprotected by the resist image by using a reagent capable of etching said areas or depositing a material on said areas.

In imagewise exposing an element of the invention, the element is usually placed in contact with an image-bearing transparency in an exposure device, which has a source of actinic radiation. Since free-radical generating addition-polymerization initiators activatable by actinic radiation generally exhibit their maximum sensitivity in the ultraviolet range, the radiation source should usually furnish an effective amount of this radiation. Such sources include carbon arcs, mercury-vapor arcs, xenon arcs, fluorescent lamps with ultraviolet radiation-emitting phosphors, argon glow lamps, electronic flash units and photographic flood lamps. Of these, the mercury-vapor arcs are customarily used at a distance of one and one-half to 20 inches from the photopolymerizable layer. It is noted, however, that in certain circumstances it may be advantageous to expose with visible light, using a photoinitiator sensitive in the visible region of the spectrum, e.g., 9,10-phenanthrenequinone or a combination of a sensitizing dye such as methylene blue with an initiator. In such cases, the radiation source should furnish an effective amount of visible radiation. Many of the radiation sources listed above furnish the required amount of visible light.

This invention will now be further illustrated but it is not intended to be limited by the following examples.

EXAMPLE 1

Photopolymerizable compositions were prepared having the following general formula:

| | Parts by Weight |
|---|---|
| Methylene chloride | 100 |
| Polymethyl methacrylate (inherent viscosity 1.20 (0.5% solution in chloroform at 25° C.)) | 12.15 |
| 2-o-chlorophenyl-4-m-anisyl-5-phenyl imidazolyl dimer | 0.081 |
| 2-mercapto benzothiazole | 0.407 |
| Monomer | 24.4 | where the monomer is one of the following: trimethylol propane triacrylate(1), bis(2-methacryloxyethyl) adipate (2), bis(4-methacryloxybutyl) methacrylate (3), bis(6-methacryloxyhexyl) adipate (4), bis(6-methacryloxyhexyl) malonate (5), bis(5-methacryloxydecyl) adipate (6).

The ingredients were thoroughly mixed and coated on a 0.001 inch (0.0254 mm.) thick polyester film by means of a doctor knife so that the dried film was 0.001–0.002 inch thick. After solvent evaporation, a 0.001 inch thick polyethylene cover film was laminated to the surface of the photopolymerizable layer. The films produced were cut into 0.5 inch wide strips and irradiated 5 minutes in a vacuum printing frame under 25 inches Hg vacuum at a distance of 17 inches with a 2500 watt Xenon arc (NuArc ® Platemaker). The polyester and polyethylene films were carefully peeled off and the strips of photopolymer were tested in an Instron ® tensile tester, with the following results:

| Monomer | Elongation to Break, % | Tensile Strength Dynes/cm$^2$ | Modulus, Dynes/cm$^2$ |
|---|---|---|---|
| 1 (Control) | 2.8 | $2.5 \times 10^8$ | $1.7 \times 10^{10}$ |
| 2 | 7 | $2.2 \times 10^8$ | $9 \times 10^9$ |
| 3 | 8 | $2.4 \times 10^8$ | $7.4 \times 10^9$ |
| 4 | 95 | $3.4 \times 10^7$ | $1.1 \times 10^9$ |
| 5 | 15 | $2.4 \times 10^8$ | $1.1 \times 10^{10}$ |
| 6 | 98 | — | $8.4 \times 10^8$ |

Other samples of the films 2-6 were laminated to copper after removing the polyethylene film and exposed through a negative to the above light source for 75 seconds, yielding a hardened image. The unexposed areas were then removed by spraying with 1,1,1-trichloroethane at 65° F. The remaining image was useful as a resist, protecting the underlying copper surface from attack by reagents such as ferric chloride solutions.

With trimethylol propane triacrylate as the monomer this resist image was brittle, so that a sharp knife would not cut it without shattering and, separation from the copper around the knife cut. With the novel monomers (2) through (6) of the invention, the resist images obtained were flexible and a clear cut was easily obtained. This property is useful in the manufacture of printed circuits as it allows the trimming of oversized image lines which otherwise would cause the rejection of finished circuit boards.

EXAMPLE 2

Coating solutions were prepared by thoroughly mixing the following ingredients:

| | Parts by Weight |
|---|---|
| Methylene chloride | 100 |
| Polymethyl methacrylate (inherent viscosity 0.20) (0.5% solution in chloroform at 25° C.) | 16 |
| 2-o-chlorophenyl-4-m-anisyl-5-phenyl imidazolyl dimer | 1.33 |
| 4,4',4''-methylidyne tris (N,N-dimethylaniline) | 0.0667 |
| Monomer | 16 |

These compositions were coated, dried, exposed and tested as in Example 1 with the following results:

| Monomer | Elongation to Break, % | Tensile Strength, Dynes/cm$^2$ | Modulus Dynes/cm$^2$ |
|---|---|---|---|
| Trimethylol propane triacrylate- (Control) | 2 | $1.6 \times 10^5$ | $1.1 \times 10^{10}$ |
| bis(6-methacryloxyhexyl) adipate | 6 | $5.3 \times 10^4$ | $2.3 \times 10^9$ |

Coated and dried samples may be used as photoresists in a manner similar to that described in Example 1. Samples containing bis(6-methacryloxyhexyl) adipate as monomer gave flexible resist images.

EXAMPLE 3

Photopolymerizable compositions were prepared by thoroughly mixing the following ingredients:

| | Parts by Weight |
|---|---|
| Methylene chloride | 100 |
| Copolymer of methyl methacrylate and methacrylic acid (8% by wt. methacrylic acid, 92% by wt. methyl methacrylate, average molecular weight 70,000). | 16 |
| 2-o-chlorophenyl-4-m-anisyl-5-phenyl imidazolyl dimer | 16 |
| | 1.33 |
| 4,4',4'-methylidyne tris (N,N-dimethyl aniline) | 0.0667 |
| Monomer | 16 |

The resulting compositions were coated, dried, exposed and tested as in Example 1 with the following results:

| Monomer | Elongation to Break, % | Tensile Strength Dynes/cm$^2$ | Modulus Dynes/cm$^2$ |
|---|---|---|---|
| Trimethylol propane triacrylate- (Control) | 2 | $8 \times 10^4$ | $6 \times 10^9$ |
| bis(6-methacryloxyhexyl) adipate | 6 | $1.3 \times 10^5$ | $3 \times 10^9$ |

These coatings may be used as photoresists as described in Example 1, or after exposure they may be developed with a solution of 7.5% butyl cellulose and 1% sodium tetraborate decahydrate in water. Resist images formed using the coating solution containing bis-(6-methacryloxyhexyl)adipate as monomer were less brittle than those formed using the coating solution containing the control.

EXAMPLE 4

Coating solutions having the following composition were exposed in a manner similar to that described in Example 1.

| | Parts by Weight |
|---|---|
| Methylene chloride | 100 parts |
| Polymethyl methacrylate (inherent viscosity 1.20 (0.5% solution in chloroform at 25° C.)) | 16 |
| 2-tert-butyl anthraquinone | 1.3 |
| Monomer | 16 |

The exposed strips were tested as described in Example 1, with the following results:

| Monomer | Elongation to Break, % | Modulus Dynes/cm$^2$ |
|---|---|---|
| Trimethylol propane triacrylate- (control) | 3 | $5 \times 10^9$ |
| bis(6-acryloxyhexyl) adipate | 7 | $1.2 \times 10^9$ |

Coated and dried samples may be used as photoresists as described in Example 1.

EXAMPLE 5

Photopolymerizable compositions comprising the following ingredients were coated on suitable film supports such as 0.001" thick polyester films by means of a doctor knife so that the dried films were 0.0025" thick.

|  | Parts by Weight |
|---|---|
| Methylene chloride | 100 |
| Polymethyl methacrylate (inherent viscosity 1.20 (0.25 percent soln. in chloroform at 25° C.)) | 16 |
| 4,4'-bisdimethyl aminobenzophenone | 0.133 |
| Benzophenone | 0.267 |
| Monomer | 16 |

The dried samples were laminated to a clean copper surface and exposed through a negative to a 1000 watt medium pressure mercury light source at a distance of 5 inches for 20 seconds so as to produce a hardened image. With trimethylol propane triacrylate as the monomer, this image was brittle whereas with bis(6-acryloxyhexyl) adipate as the monomer the resist image formed was flexible and a clean cut was easily obtained when cut with a sharp knife.

EXAMPLE 6

Four photopolymerizable compositions were prepared having the following general composition in methylene chloride solution and coated by doctor knife to a dry thickness of 0.0018±0.0001 inch on a 0.001 inch thick polyethylene terephthalate film.

| Components | Parts by Weight |
|---|---|
| Copolymer of ethyl acrylate (4%) and methyl methacrylate (96%) whose 35% solution in methyl ethyl ketone has a viscosity of about 1500 cps. at 25° C. (Binder) | 1.3 |
| Monomer | 1.0 |
| 4,4'-Bis(dimethylamino)benzophenone (initiator) | 0.01 |
| Benzophenone (initiator) | 0.02 |

Film 1 monomer is bis(6-methacryloxyhexyl) adipate; Film 2 monomer is trimethylolpropane triacrylate (control); Films 3 and 4 are similar to Films 1 and 2, respectively, but they each contain an additional 0.126 part of titanium dioxide.

The four films were tested as photoresists by utilizing the following commonly used procedure:
1. Laminating the films to a scrubbed copper laminate in a Du Pont Riston ® A-24 Laminator,
2. exposing to actinic radiation through a negative containing line and space patterns in a Colight ® "DMVL-A" exposure unit,
3. dissolving away unexposed areas by a methyl chloroform spray in a Du Pont Riston ® "C" Processor, 68° F., 5 feet/minute conveyor speed,
4. cleaning by dipping for one minute in Selrex "Oxytron ® 140" acidic soap bath (140° F.), one minute in tap water rinse, one minute dip in ammonium persulfate solution, 30-second tap water rinse, 15-second sulfuric acid (10% V/V) dip, 15-second tap water rinse,
5. plating unexposed areas using copper sulfate at 80° F., 30 amp/sq. ft for 36 minutes,
6. rinsing 30-second tap water rise,
7. cleaning by repeating step 4,
8. dipping 15-second fluoboric acid (25% V/V),
9. plating lead/tin (Hithro ®), 15 amp/sq. ft. for 15 minutes, and
10. rinsing 30-second tap water. The plated boards were examined with the following results:
   (a) Films 1 and 2 had cleanly resolved 0.004 inch lines and 0.003 inch spaces; Films 3 and 4 resolved no finer than 0.0063 inch lines and 0.005 inch spaces.
   (b) Film 3 had partially peeled off the copper board so that areas designed to be protected from the plating solutions were plated; the other three films remained intact.

the films containing titanium dioxide are substantially inferior in performance as photoresists to the films not containing titanium dioxide. Film 3, Bis-(6-methacryloxyhexyl) adipate containing titanium dioxide, in particular, is not functional as a photoresist.

What is claimed is:

1. A method comprising:
(1) applying to a surface the surface of a solid, unexposed photopolymerizable layer of a composition consisting essentially of:
   (a) a photoinitiator;
   (b) a macromolecular linear organic film-forming polymeric binder; and
   (c) a photopolymerizable monomer, with the following present:
      (i) 0.001 to 20 parts by weight, based on the weight of monomer, of nonperoxide photoinitiator, which is activatable by actinic radiation and thermally inactive at and below 85° C.;
      (ii) 10 to 95 parts by weight, based on the total weight of the photopolymerizable composition, of binder; and
      (iii) 5 to 90 parts by weight, based on the total weight of the photopolymerizable composition of an ethylenically unsaturated addition-polymerizable compound having a molecular weight of at least 150 and a boiling point of above 100° C. and having the formula:

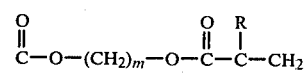

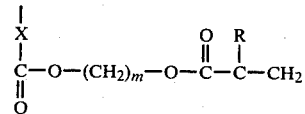

where R = H, CH$_3$; X = 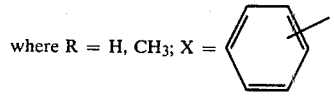

or (CH$_2$)$_{n-2}$; and m and n are independently from 2 to 10; while the other surface of the layer has adhered thereto with low to moderate adherence a thin, flexible sheet support, then in either order;
(2) exposing the layer, imagewise, to actinic radiation to form a polymeric image in the layer;
(3) removing the sheet support from the resulting image-bearing layer; and (4) removing the unexposed areas of the layer to form a resist image of polymeric materials; and (5) permanently modifying the adjacent areas on said surface which are unprotected by the resist image by using a reagent capable of etching said areas or depositing a material on said areas.

2. The process of claim 1 wherein said composition the ethylenically unsaturated addition polymerizable compound is selected from bis(2-methacryloxyethyl) adipate, bis-(3-methacryloxypropyl) adipate, bis(4-metharyloxybutyl) adipate, bis(6-methacryloxyhexyl) adipate, bis(10-methacryloxydecyl) adipate, bis(6-methacryloxyhexyl) malonate, bis(6-methacryloxyhexyl) phthalate, bis(2-methacryloxyethyl) phthalate, bis(2-methacryloxyethyl) isophthalate, bis(2-methacryloxyethyl) terephthalate, bis(10-methacryloxydecyl) sebacate, bis(6-acryloxyhexyl) adipate, and bis(2-acryloxyethyl) adipate.

3. The process of claim 1 wherein said polymeric binder is an acrylic polymer.

4. The process of claim 3 wherein said acrylic polymer is polymethyl methacrylate.

5. The process of claim 1 wherein in said composition any of the photoinitiator compound, the polymeric binder, and the ethylenically unsaturated addition polymerizable compound is present as a mixture of several such materials.

* * * * *